US009972792B2

(12) United States Patent
De Vries et al.

(10) Patent No.: US 9,972,792 B2
(45) Date of Patent: May 15, 2018

(54) ELECTRON TRANSPORT LAYER AND FILM HAVING IMPROVED THERMAL STABILITY

(71) Applicants: Dow Global Technologies LLC, Midland, MI (US); Rohm and Haas Electronic Materials LLC, Marlborough, MA (US)

(72) Inventors: Timothy S. De Vries, Midland, MI (US); Kenneth L. Kearns, Jr., Midland, MI (US); Travis E. McIntire, Midland, MI (US); Sukrit Mukhopadhyay, Midland, MI (US); Peter Trefonas, III, Medway, MA (US); William H. H. Woodward, Harbor Beach, MI (US)

(73) Assignees: Rohm and Haas Electronic Materials LLC, Malborough, MA (US); Dow Global Technologies LLC, Midland, MI (US)

( * ) Notice: Subject to any disclaimer, the term of this patent is extended or adjusted under 35 U.S.C. 154(b) by 32 days.

(21) Appl. No.: 15/083,331

(22) Filed: Mar. 29, 2016

(65) Prior Publication Data
US 2017/0084847 A1    Mar. 23, 2017

Related U.S. Application Data

(60) Provisional application No. 61/151,105, filed on Apr. 22, 2015.

(51) Int. Cl.
*H01B 1/12*       (2006.01)
*H01L 51/00*     (2006.01)
(Continued)

(52) U.S. Cl.
CPC ........... *H01L 51/0077* (2013.01); *H01B 1/12* (2013.01); *H01B 1/121* (2013.01);
(Continued)

(58) Field of Classification Search
CPC ........... H01L 2251/558; H01L 51/0035; H01L 51/0058; H01L 51/0067; H01L 51/0077;
(Continued)

(56) References Cited

U.S. PATENT DOCUMENTS

| 8,950,328 B1 * | 2/2015 | Lang | B41M 3/00 |
| | | | 101/483 |
| 2003/0207500 A1 * | 11/2003 | Pichler | H01L 51/5259 |
| | | | 438/127 |

(Continued)

FOREIGN PATENT DOCUMENTS

| JP | 2014044972 A | 3/2014 |
| WO | 2012160714 A1 | 11/2012 |
| WO | 2013122182 A1 | 8/2013 |

OTHER PUBLICATIONS

Sasabe, et al; Extremely Low Operating Voltage Green Phosphorescent Organic Light-Emitting Devices; Advanced Functional Materials, vol. 23, Issue 44, pp. 5550-5555, Nov. 26, 2013.
(Continued)

*Primary Examiner* — Mark Kopec
*Assistant Examiner* — Jaison P Thomas
(74) *Attorney, Agent, or Firm* — S. Matthew Cairns

(57) ABSTRACT

Aspects of the invention provide a composition having a blend of an electron transport material and an organo alkali-metal salt wherein the salt has a glass transition greater than 115° C. The organo-alkali metal salt may be selected from the group consisting of lithium 2-(2-pyridyl)phenolate (LiPP), lithium 2-(2',2"-bipyridine-6'-yl)phenolate (LiBPP), 2-(isoquinoline-10-yl)phenolate (LiIQP), and lithium 2-(2-phenylquinazolin-4-yl)phenolate and lithium 2-(4-phenylquinazolin-2-yl)phenolate. In a preferred embodiment, the organo-alkali metal salt is lithium 2-(2',2"-bipyridine-6'-yl)phenolate (LiBPP). Aspects of the invention also provide films and devices having a film layer prepared from the composition.

18 Claims, 1 Drawing Sheet

(51) Int. Cl.
H01L 51/50 (2006.01)
H01L 51/52 (2006.01)

(52) U.S. Cl.
CPC ...... H01L 51/0035 (2013.01); H01L 51/0058 (2013.01); H01L 51/0067 (2013.01); H01L 51/0079 (2013.01); H01L 51/5076 (2013.01); H01L 51/5253 (2013.01); H01L 2251/558 (2013.01)

(58) Field of Classification Search
CPC ............ H01L 51/0079; H01L 51/5076; H01L 51/5253; H01B 1/121; H01B 1/124
See application file for complete search history.

(56) References Cited

U.S. PATENT DOCUMENTS

| | | |
|---|---|---|
| 2006/0251919 A1 | 11/2006 | Aziz et al. |
| 2013/0015431 A1 | 1/2013 | Kamalasanan et al. |
| 2013/0248830 A1* | 9/2013 | Welsh ................. H01L 51/0067 257/40 |
| 2014/0084280 A1* | 3/2014 | Chiba ................. H01L 51/5072 257/40 |
| 2014/0332789 A1* | 11/2014 | Dorok ................. H01L 51/0077 257/40 |
| 2015/0179969 A1 | 6/2015 | Lin et al. |
| 2016/0020406 A1* | 1/2016 | Pu ....................... H01L 51/5092 257/40 |

OTHER PUBLICATIONS

Chiba, et al; Lithium Phenolate Complexes With a Pyridine-Containing Polymer for Solution-Processable Electron Injection Layers in PLEDS; Advanced Functional Materials; vol. 24, No. 38; pp. 6038-6045; Oct. 15, 2014.

Pu, et al; Lithium Phenolate Complexes for an Electron Injection Layer in Organic Light-Emitting Diodes; Organic Electronics; vol. 10, Issue 2; pp. 228-232; 2008.

* cited by examiner

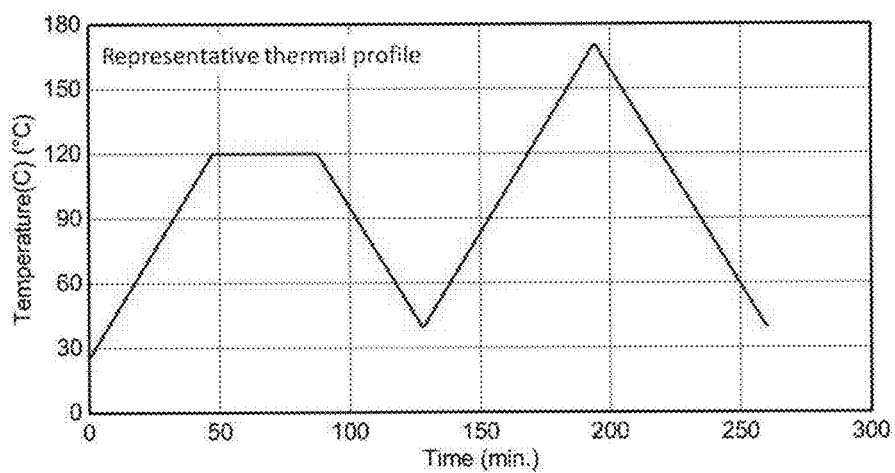

ELECTRON TRANSPORT LAYER AND FILM HAVING IMPROVED THERMAL STABILITY

RELATED APPLICATIONS

This application claims the benefit of priority under 35 U.S.C. § 119(e) to U.S. Provisional Application No. 62/151,105, filed Apr. 22, 2015, which is incorporated herein by reference in its entirety.

FIELD

The present invention relates generally to electronic devices incorporating organic light emitting diodes (OLEDs), and in particular, to compositions for use in an electron transporting layer of an OLED.

BACKGROUND

Electroluminescence (EL) devices are display devices that are composed of films containing organic compounds as an electroluminescent layer. In a more sophisticated, but common form, EL devices may include anode and cathode layers between which are disposed a hole transport layer, an electron transport layer, and an emissive layer that is disposed between the hole transport and electron transport layers.

Compounds in the various layers are generally classified as electroluminescent materials and/or charge transport materials. Several properties are required for such electroluminescent and charge transport compounds including high fluorescent quantum yield in solid state, sufficient mobility of electrons and holes, chemical stability during processing, and the ability to form morphologically stable films. These desired features increase the lifetime of an EL device. There is a continual need for improved electroluminescent compounds and films containing the same.

U.S. Patent Application Publication No. 2006/0251919A1 discloses an EL device having OLEDs comprising an electroluminescent material layer, which comprises a mixture of at least two materials having different electron and hole transport capacities, and an electron transport layer comprising a triazine. Disclosed OLEDs may comprise an electron transport layer containing a triazine.

However, as discussed above, there remains a need for new film configurations containing new electroluminescent and charge transport compounds, and which have improved properties. These needs and others have been met by the following invention.

SUMMARY

In a first aspect, the present invention is directed to a composition for an electron transport layer in which the material comprises a blend of an electron transport material and an organo-alkali metal salt, wherein the organo-alkali metal salt has a glass transition temperature (Tg) greater than 115° C. As explained below, the inventors of the present invention have discovered that such blends can provide EL devices having improved performance.

During the manufacture of EL devices, such as devices incorporating organic light emitting diodes (OLEDs), the multilayer device is typically encapsulated to help prevent degradation of the EL device, which may result from exposure to environmental oxygen and moisture. A common material used in the encapsulation process is a thermoset epoxy resin. Such epoxy resins are typically cured at a temperature of about 120° C. Conventional blends utilized in many electron transport layers comprise a blend of an electron transport material and a lithium quinolate salt (LiQ). The inventors have discovered that such blends result in a blended electron transport material having a glass transition temperature that is below or near the temperature used in the encapsulation process. While not wishing to be bound by theory, it is believed that the lithium quinolate salt plasticizes the electron transport material, which results in the blended composition having a lower glass transition temperature than the neat electron transport material. Consequently, the efficiency and performance of the EL device may be adversely affected as a result of the encapsulation process.

The inventors have discovered that by blending the electron transport material with an organo-alkali salt having a glass transition temperature greater than 115° C., such problems associated with the prior art may be avoided.

In one embodiment, the present invention provides a composition comprising a blend of an electron transport material and an organo alkali-metal salt having a glass transition temperature greater than 115° C., and preferably at least 120° C., and more preferably at least 125° C.

In one embodiment, the organo-alkali metal salt is selected from the group consisting of lithium 2-(2-pyridyl)phenolate (LiPP), lithium 2-(2',2"-bipyridine-6'-yl)phenolate (LiBPP), 2-(isoquinoline-10-yl)phenolate (LiIQP), lithium 2-(2-phenylquinazolin-4-yl)phenolate, and lithium 2-(4-phenylquinazolin-2-yl)phenolate. In a preferred embodiment, the organo-alkali metal salt is lithium 2-(2',2"-bipyridine-6'-yl)phenolate (LiBPP).

Embodiments of the invention provide films and devices that have improved thermal properties at temperatures which are typically experienced during the encapsulation process. For example, when subjected to the Encapsulation Mimic Test, a film formed from the composition exhibits a percent change in thickness that is less than 20%, and in particular, less than 18%, and more particularly, less than 16%. In one embodiment, when subjected to the Encapsulation Mimic Test, a film formed from the composition exhibits a percent change in thickness that is between 9 and 19%.

Aspects of the invention are also directed to films and articles comprising the inventive composition. In one embodiment, the invention provides an electronic device comprising a pair of electrodes, and at least one electron transport layer comprising a blend of an electron transport material and an organo-alkali metal salt sandwiched between the electrodes, wherein the metal salt has a glass transition temperature greater than 115° C.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 1 is a chart representing a thermal cycling used for the Encapsulation Mimic Test of films comprising a blend of an electron transport material and an organo-alkali metal salt.

DETAILED DESCRIPTION

As discussed above, the present invention is directed to a composition for charge transport comprising a blend of an electron transport material and an organo-alkali metal salt having a glass transition temperature greater than 115° C.

In the present invention, the electron transport material and the alkali-organo salt cooperate in the blend to transport electrons from the cathode or electron injection layer, through the blend, and into an adjacent organic layer. Advantageously, properties of the inventive composition are not adversely affected by the encapsulation process.

A wide variety of electron transport materials may be used in embodiments of the present invention. For example, suitable materials for the electron transport material may include small organic molecules, and polymers containing π-electron systems in the main chain or in pendant groups (e.g., π-conjugated polymers). For electron transport materials it is also desirable that the material have a relatively shallow LUMO (lowest unoccupied molecular orbital) ranging from about −1.0 to −2.5 eV together with deep HOMO (highest occupied molecular orbital) ranging from −4.5 to −7.0 eV.

In one embodiment, the electron transport material may exhibit a triplet energy ranging from 1.0 to 3.2 eV, and preferably from 1.5 to 3.1 eV, and more preferably, from 1.7 to 3.1 eV.

In some embodiments, the electron transport material may have a HOMO level ranging from about −4.7 to −7.0 eV, and in particular, from −5.0 to −6.5 eV, and more preferably, from −5.4 to −6.0 eV. The electron transport material may have a LUMO level from about −1.5 to −2.5 eV, and in particular, from −1.6 to −2.2 eV, and more preferably, from −1.7 to −2.0 eV. In one embodiment, the electron transport material has a triplet energy greater than 1.8 eV, and in particular, greater than 2.0 eV, and more particularly, greater than 2.1 eV.

In addition, electron transport materials for use in the present invention may also have relatively high glass transition temperatures. For example, the electron transport material may have a glass transition temperature ranging from 125 to 200° C., and typically, from 130 to 200° C., and more typically, from 140 to 200° C.

Generally, suitable small organic molecules include molecules having a plurality of aromatic ring systems, and that are capable of forming amorphous glass films. Typically, such molecules may have molecular weights ranging from 350 to 1,000 Daltons. Examples of suitable small organic molecules that may be used in embodiments of the present invention may include triazine-based compounds, such as 3,5-bis(4-tert-butylphenyl)-4-phenyl-4H-1,2,4-triazole (TAZ) and 1,2,4-triazole and diphenylphosphine oxide moieties (TPO), 1,3,5-tris(1-phenyl-1H-benzo[d]imidazol-2-yl)benzene (TPBI) and 2,9-dimethyl-4,7-diphenyl-1,10-phenanthroline (BCP tris(2,4,6-trimethyl-3-(pyridin-3-yl)phenyl)borane (3TPYMB), 4,4'-Bis(4,6-diphenyl-1,3,5-triazin-2-yl)biphenyl (BTB), 2-(4-(9,10-Di(naphthalen-2-yl)anthracen-2-yl)phenyl)-1-phenyl-1H-phenanthro[9,10-d]imidazole (AND-PAimi), 4,7-Diphenyl-2,9-bis(4-(1-phenyl-1H-benzo[d]imidazol-2-yl)phenyl)-1,10-phenanthroline (DBimiBphen), 3,5-Di(pyren-1-yl)pyridine (PY1), diphenylbis(4-(pyridin-3-yl)phenyl)silane (DPPS) and phenyl-dipyrenylphosphine oxide (POPy2).

Examples of electron transport materials that are described in U.S. Patent Publication No. 2013/0248830 In one embodiment, the electron transport material may include at least one compound selected from Formula A:

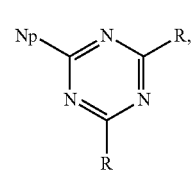

(Formula A)

wherein Np is selected from 1-naphthyl or 2-naphthyl, and wherein each R is independently selected from the following:
i) a (C6-C30)aryl, with or without substituent(s),
ii) a substituted or unsubstituted (C6-C30)aryl fused with one or more (C3-C30)cycloalkyl, with or without substituent(s),
iii) a (C3-C30)heteroaryl with or without substituent(s),
iv) a 5- to 7-membered heterocycloalkyl with or without substituent(s),
v) a substituted or unsubstituted 5- to 7-membered heterocycloalkyl fused with one or more aromatic ring(s),
vi) a (C3-C30)cycloalkyl with or without substituent(s),
vii) a substituted or unsubstituted (C3-C30)cycloalkyl fused with one or more aromatic ring(s),
viii) an adamantyl with or without substituent(s), or
ix) a (C7-C30)bicycloalkyl with or without substituent(s).

In some embodiments, the compound of Formula A may comprise the following compound:

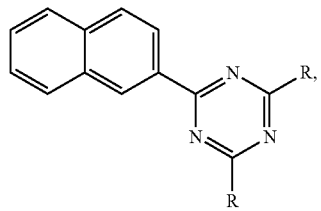

(Formula B)

wherein each R is independently selected from the following:
i) a (C6-C30)aryl, with or without substituent(s),
ii) a substituted or unsubstituted (C6-C30)aryl fused with one or more (C3-C30)cycloalkyl, with or without substituent(s),
iii) a (C3-C30)heteroaryl with or without substituent(s),
iv) a 5- to 7-membered heterocycloalkyl with or without substituent(s),
v) a substituted or unsubstituted 5- to 7-membered heterocycloalkyl fused with one or more aromatic ring(s),
vi) a (C3-C30)cycloalkyl with or without substituent(s),
vii) a substituted or unsubstituted (C3-C30)cycloalkyl fused with one or more aromatic ring(s),
viii) an adamantyl with or without substituent(s), or
ix) a (C7-C30)bicycloalkyl with or without substituent(s).

In one embodiment, for Formula A, each R is independently selected from the following
i) a (C6-C30)aryl with or without substituent(s), or
iii) a (C3-C30)heteroaryl with or without substituent(s).

In one embodiment, the electron transport material comprises one compound selected from Formula A. In other embodiments, the electron transport material may comprise one or more compounds selected from Formula A. Further examples of suitable compounds for use as the electron transport material that are encompassed by Formula A are described in U.S. Patent Publication No. 2013/0248830, the contents of which are hereby incorporated by reference.

In one embodiment, the electron transport material may include at least one compound selected from Formula C:

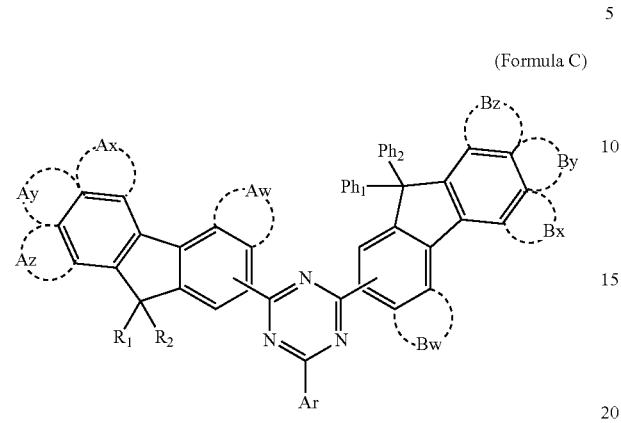

(Formula C)

wherein A is (CH), and x, y, w, z are each independently 0 or 4; and wherein x=4, and y=0, z=0 or 4, and w=0 or 4, or
wherein y=4, and x=0, z=0, and w=0 or 4, or
wherein z=4, and x=0, y=0, and z=0 or 4; and
wherein w=4, and x=0, y=0, and z=0; and
wherein B is (CH), and x, y, w, z are each independently 0 or 4; and wherein x=4, and y=0, z=0 or 4, and w=0 or 4, or
wherein y=4, and x=0, z=0, and w=0 or 4, or
wherein z=4, and x=0, y=0, and z=0 or 4; and
wherein w=4, and x=0, y=0, and z=0; and
wherein $R_1$ and $R_2$ are independently a $C_1$-$C_{20}$ alkyl or a $C_6$-$C_{30}$ aryl, each with or without one or more substituents; and wherein $Ph_1$ and $Ph_2$ are each, independently, phenyl or a substituted phenyl, and wherein Ar is an aryl, a substituted aryl, a heteroaryl, or a substituted heteroaryl;

and wherein one or more hydrogens may be optionally substituted with deuterium.

In one embodiment, the electron transport material comprises one compound selected from Formula C. In other embodiments, the electron transport material may comprise one or more compounds selected from Formulas A, B, or C.

In one embodiment, the electron transport material may be selected from the group consisting of:

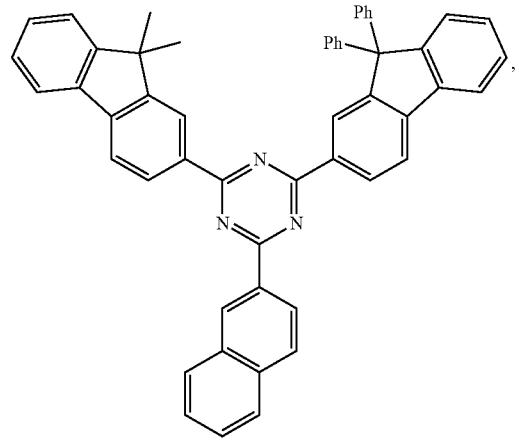

(a)

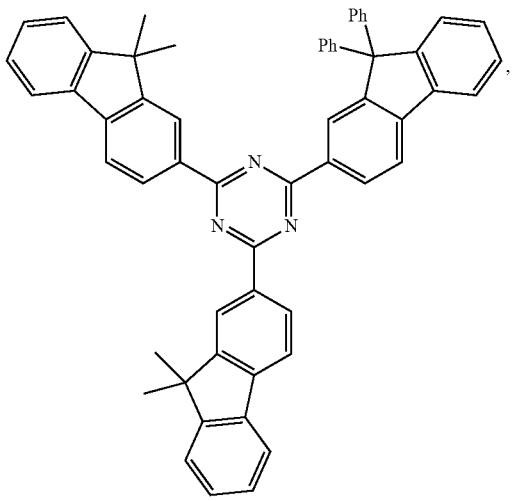

(b)

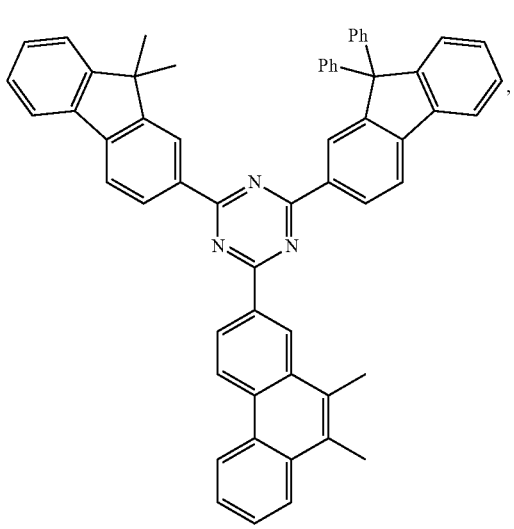

(c)

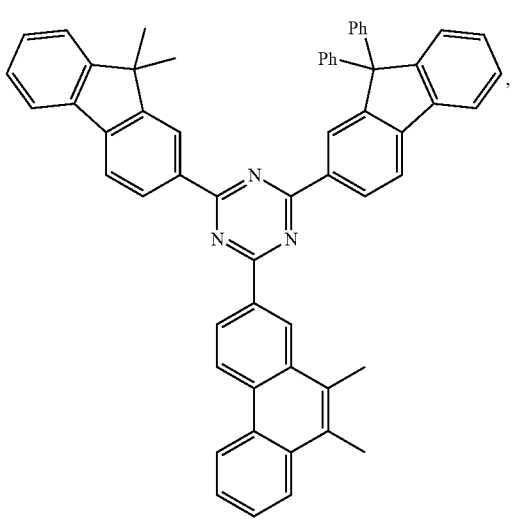

(d)

(e)
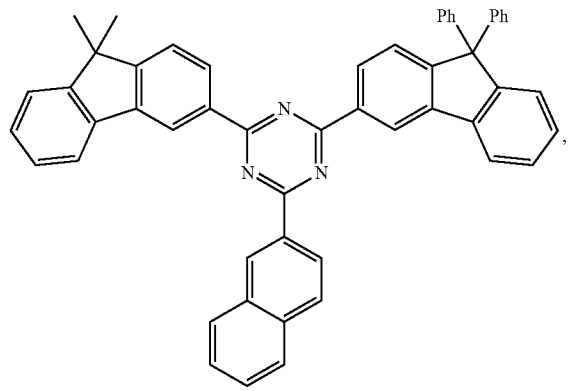
(h)
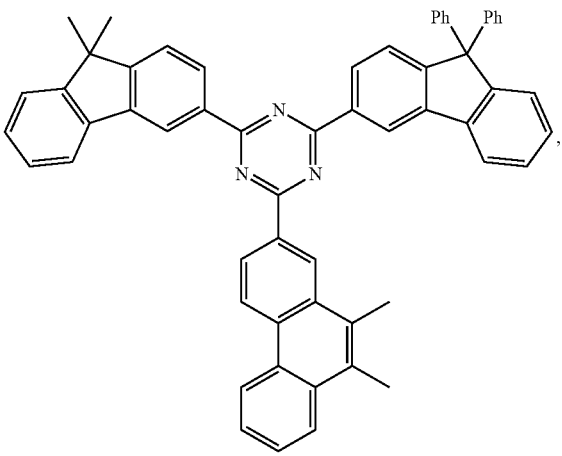
(f)
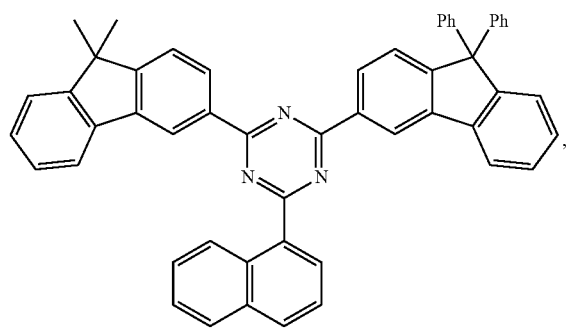
(i)
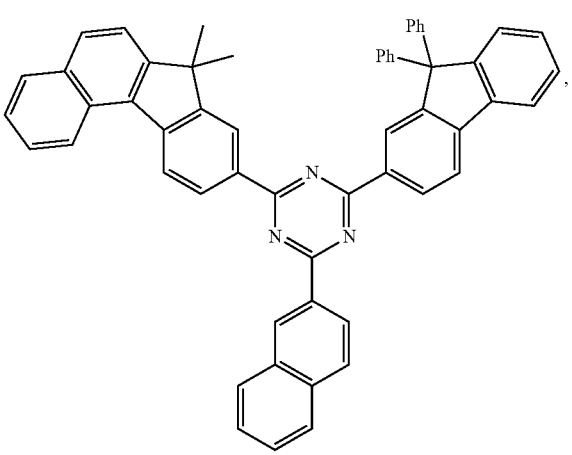
(g)
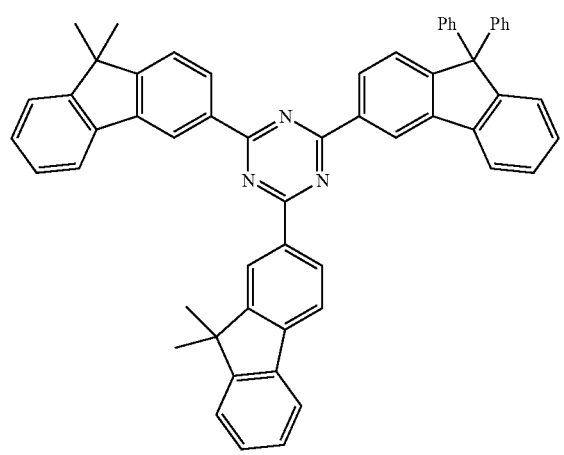
(j)
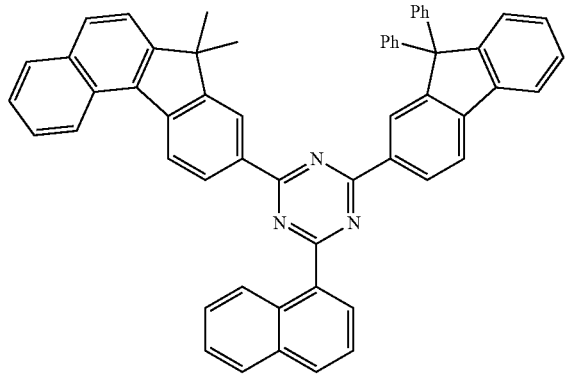

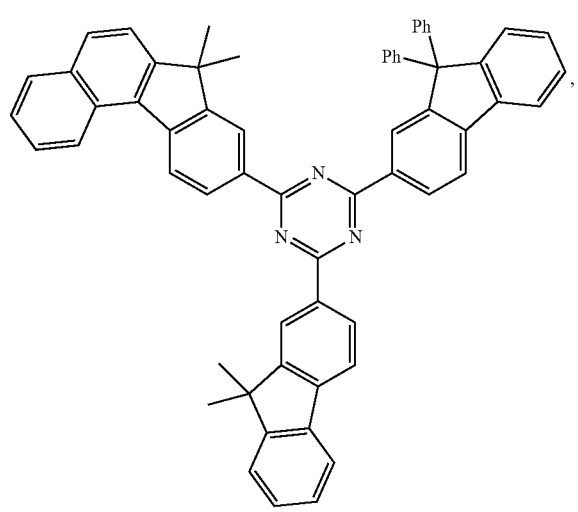
(k)
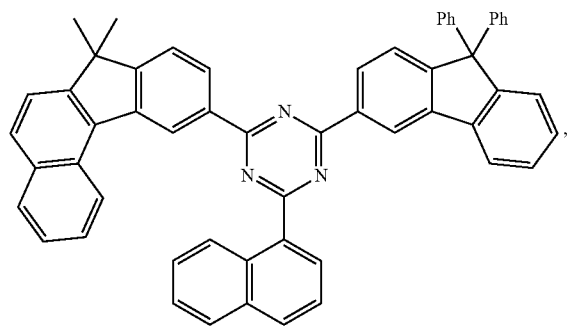
(n)
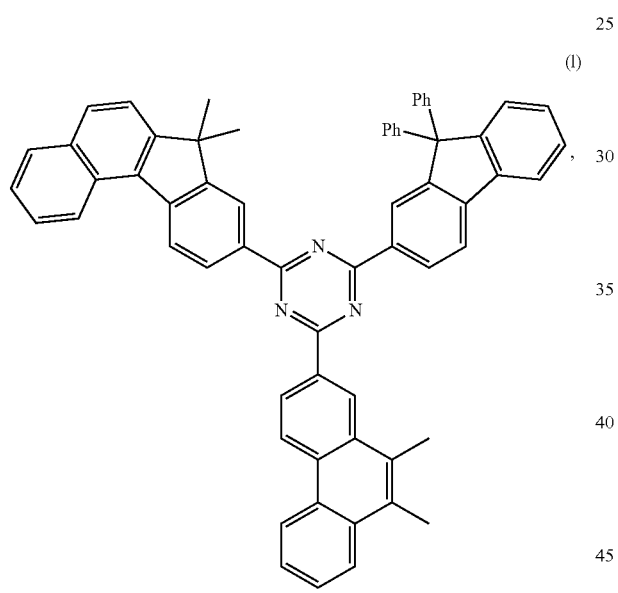
(l)
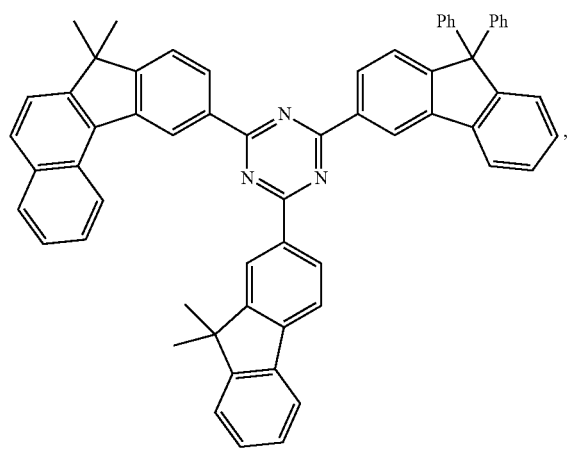
(o)
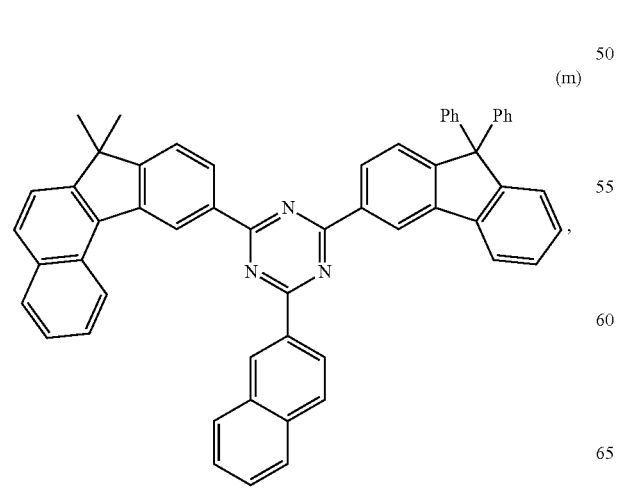
(m)
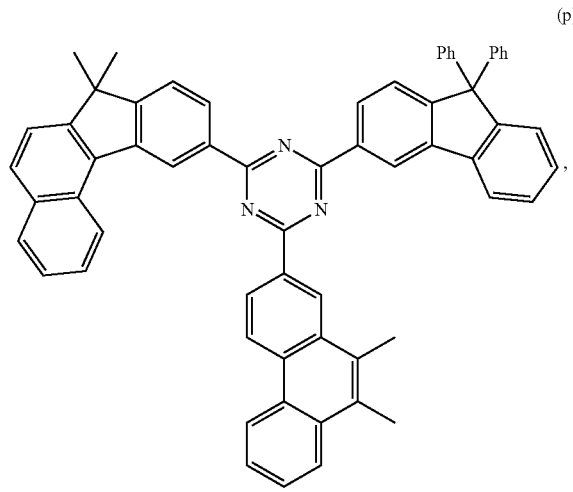
(p)

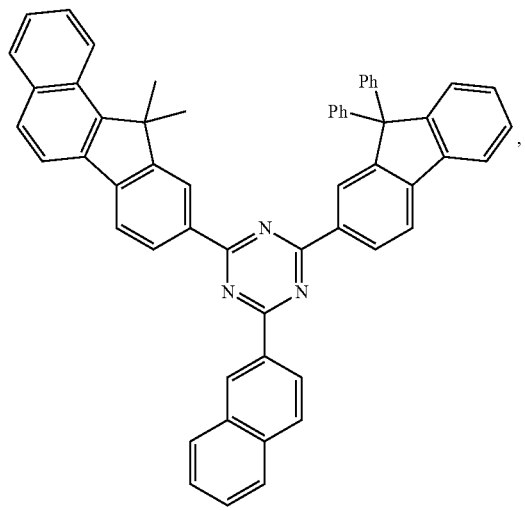
(q)
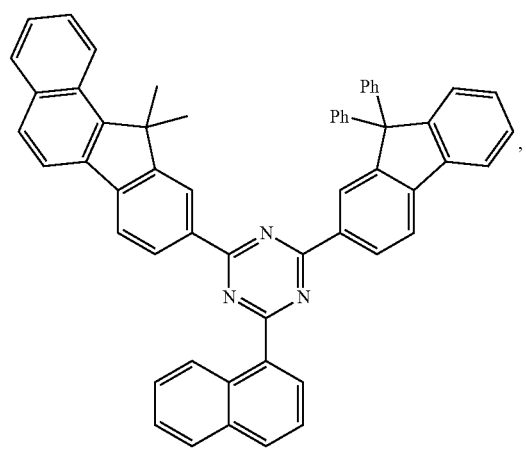
(r)
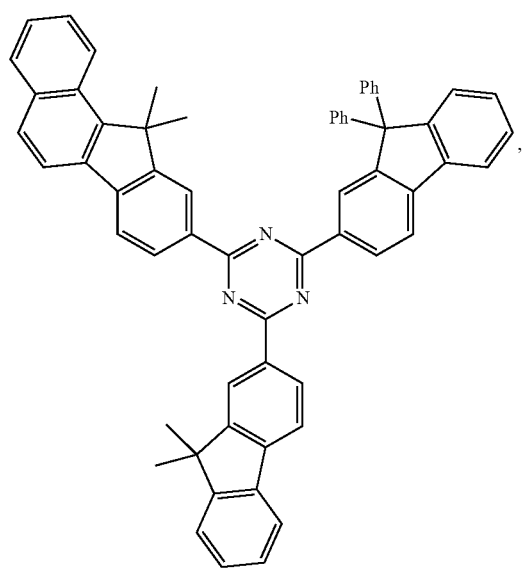
(s)
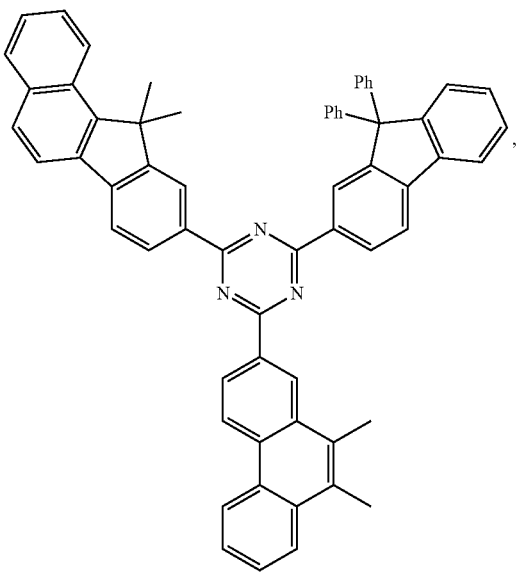
(t)
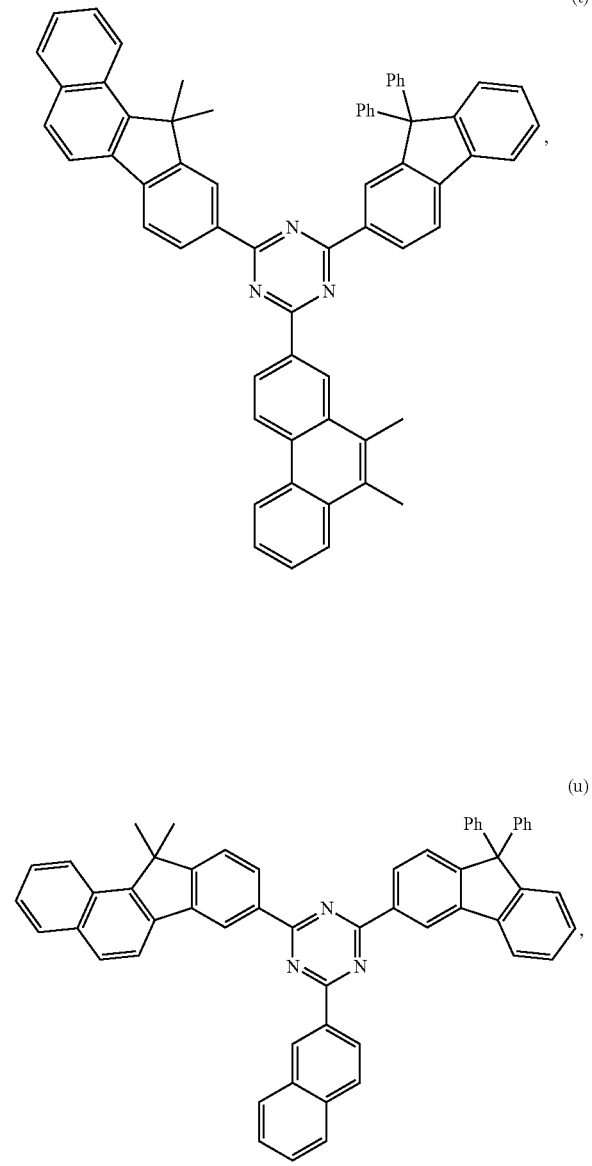
(u)
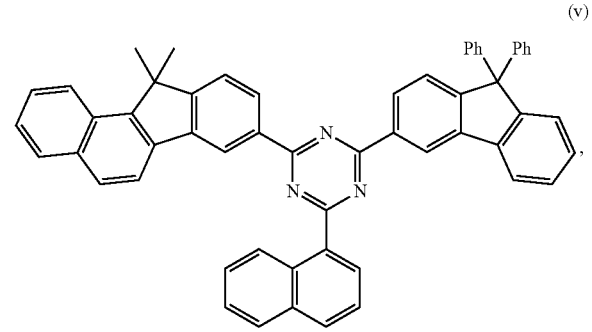
(v)

-continued
(w)
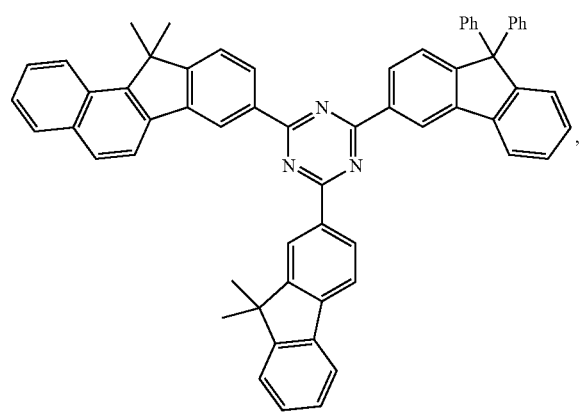
(x)
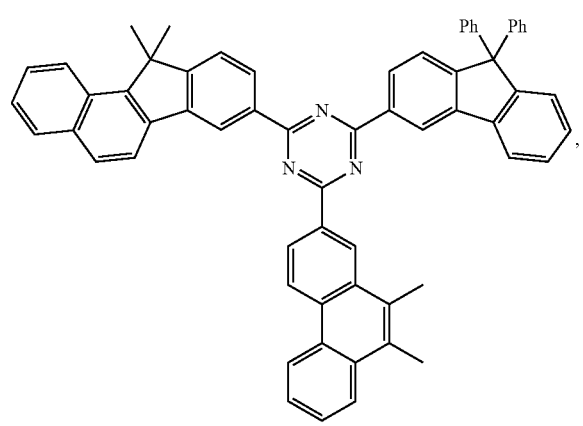
(y)
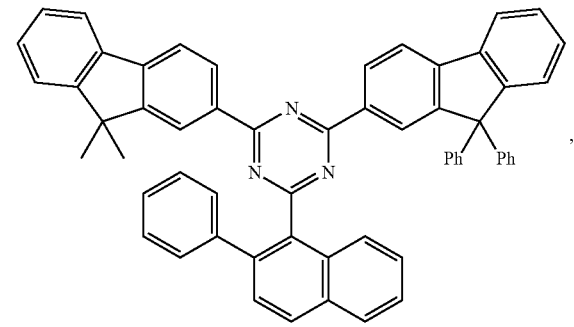
(z)
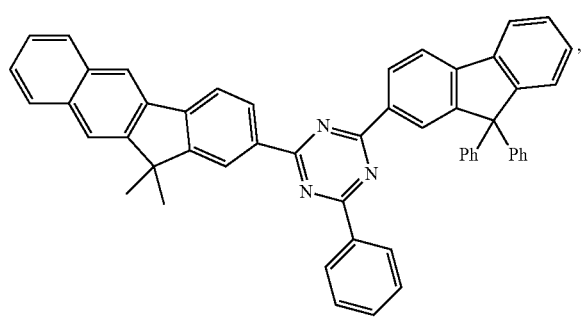
-continued
(a1)
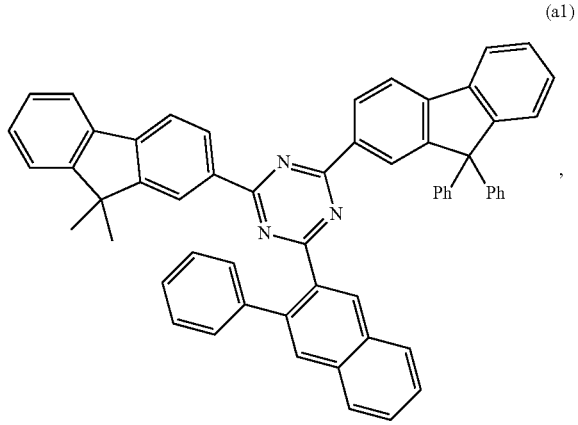
(b1)
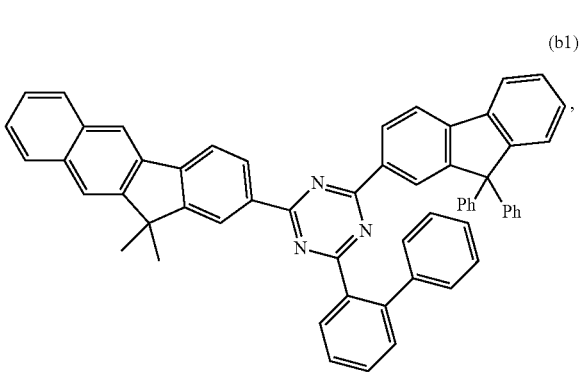
(c1)
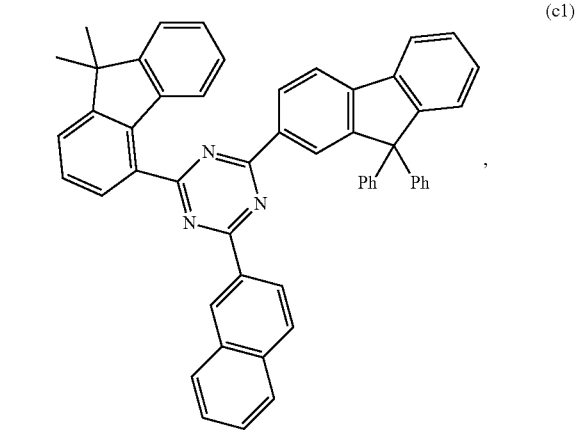
(d1)
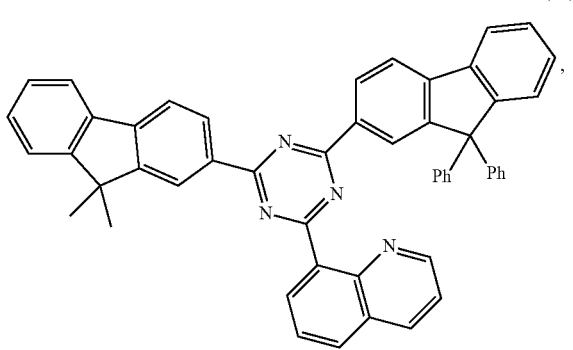

-continued

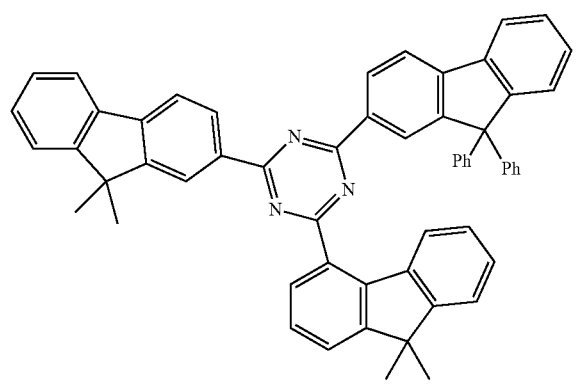

(e1), (f1), (g1), or (h1)

A further example of an electron transport material may include at least one compound selected from Formula D:

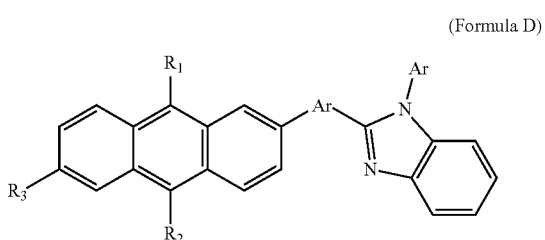

(Formula D)

wherein $R_1$ and $R_2$ are independently or simultaneously a hydrogen atom or a deuterium atom, a $C_{1-20}$ aliphatic hydrocarbon, benzene, naphthalene, biphenyl, anthracene, or a group derived from an aromatic heterocycle or an aromatic ring;

Ar is benzene, naphthalene, biphenyl, anthracene, or a group derived from an aromatic heterocycle or an aromatic ring;

$R_3$ is a hydrogen atom or a deuterium atom, an alkyl or $C_{1-20}$ aliphatic hydrocarbon, a substituted or unsubstituted benzene, naphthalene, biphenyl, anthracene, or an aromatic heterocycle or an aromatic ring.

In one embodiment, the electron transport material comprises one compound selected from Formula D. In other embodiments, the electron transport material may comprise one or more compounds selected from Formulas A, B, C, or D. In some embodiments, one or more of the hydrogen atoms in the above formulas may be optionally substituted with deuterium.

In one embodiment, the electron transport material may comprise one or more molecules selected from the group consisting of:

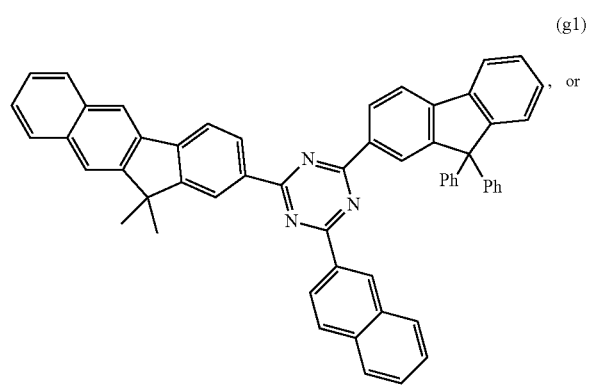

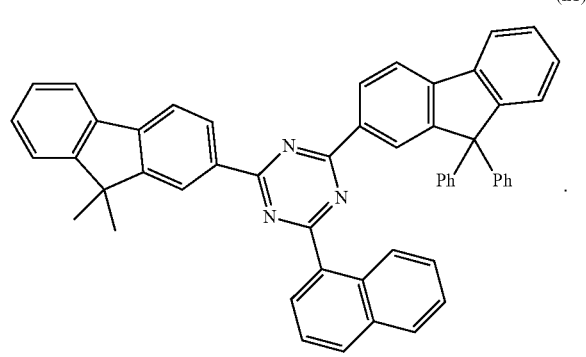

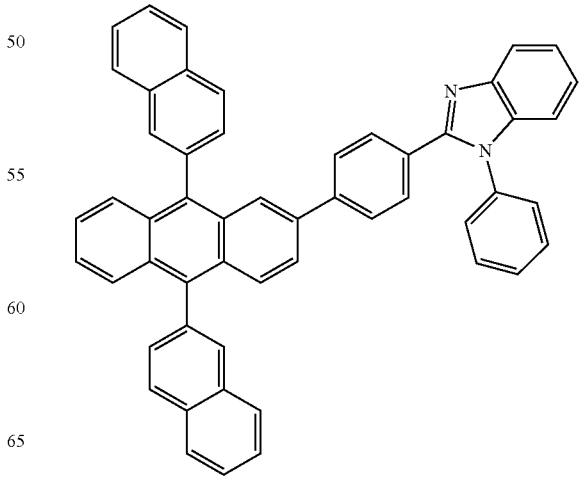

-continued

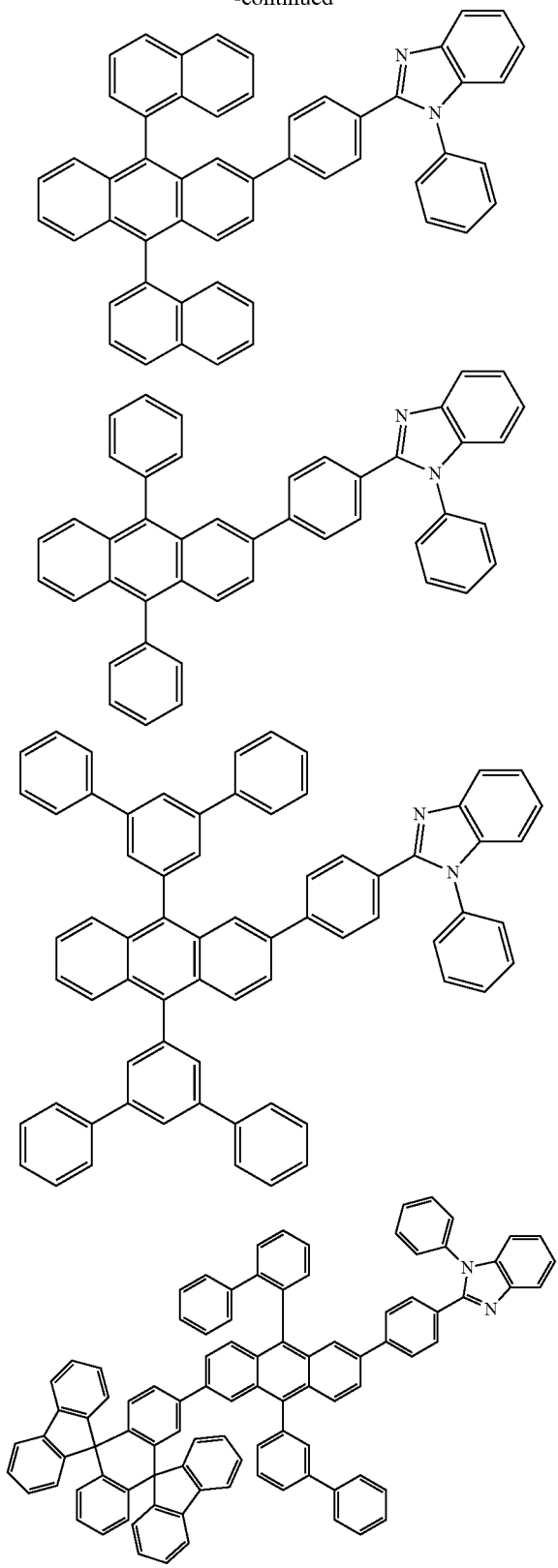

Polymers that may be used as the electron transport material may have a number average molecular mass (Mn) ranging from 2 to 100 kDa, and in particular, from 2 to 75 kDa and more particularly, from 3 kDa to 50 kDA. It should be recognized by one of ordinary skill in the art that the above molecular weight ranges are generally provided for polymers that have not undergone further processing, such as crosslinking of the polymer.

Examples of polymeric electron transport materials may include poly(p-phenylenevinylene) (PPV), poly(4,4'-biphenylenebenzobisthiazole (PBBZT), poly(9,9-dioctylfluorene-co-benzothiadiazole) (BT) polyquinoline (PPQ) poly[2,6-(4,4-bis-alkyl-4H-cyclopenta-[2,1-b; 3,4-b0]-dithiophene)-alt-4,7-(2,1,3-benzothiadiazole)](cyclopentadithiophene-benzothiadiazole) (CDT-BTZ) ((poly[2-methoxy-5 (2'ethylhexyloxy)-1,4-phenylenevinylene] (MEH-PPV), poly(thieno-[3,4-b]thiophene-altbenzo[1,2-b:4,5-b']dithiophene) (PTB), as well as other charge transport polymers.

In one embodiment of the invention, electron transport materials may also be capable of being deposited via a dry deposition process. Examples of a dry deposition process include physical vapor deposition, including evaporation and sublimation, chemical vapor deposition, organic molecular beam deposition, and molecular layer deposition. Dry deposition, in contrast to wet deposition methods, does not include solvation of the electron transport material in a solvent that is applied via a coating process, such as spin coating, spray coating, slot-die printing, or ink-jet printing.

In other embodiments, the electron transport material may be capable of being deposited via a wet deposition process, such as spin coating, spray coating, slot-die printing, or ink-jet printing.

As discussed previously, the electron transport material is advantageously blended with an organo-alkali metal salt having a glass transition temperature greater than 115° C., and in particular, at least 120° C. Preferably the organo-alkali metal salt has a glass transition temperature from 130 to 200° C., and more preferably, from 140 to 200° C.

In some embodiments, the organo-alkali salt has a molecular weight greater than 152 Daltons, and in particular, from 180 to 305 Daltons, and more particularly, from about 220 to 305 Daltons.

Organo-alkali metal salts that may be used in embodiments of the invention may include the following general formula:

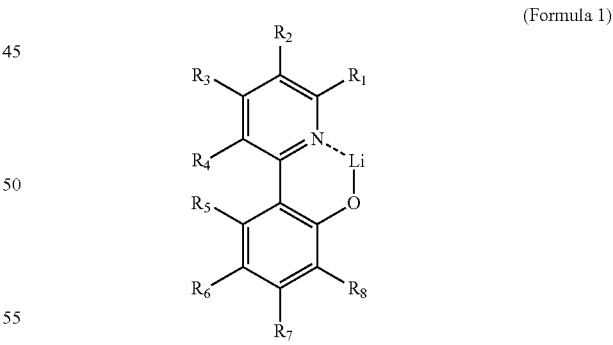

(Formula 1)

wherein $R_1$, $R_2$, $R_3$, $R_4$, $R_5$, $R_6$, $R_7$, and $R_8$ are independently or simultaneously hydrogen, a $C_{1-20}$ aliphatic hydrocarbon, benzene, naphthalene, biphenyl, a group derived from an aromatic heterocycle or an aromatic ring, or groups forming one or more fused ring structures, and wherein at least one of $R_1$, $R_2$, $R_3$, $R_4$, $R_5$, $R_6$, $R_7$, and $R_8$ is not a hydrogen.

Other organo-alkali metal salts that may be used in the present invention may include bicyclic rings having at least one hetero atom according to the following formula:

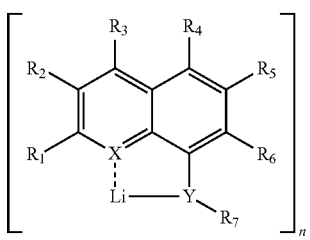

(Formula 2)

wherein $R_1$, $R_2$, $R_3$, $R_4$, $R_5$, and $R_6$ are independently or simultaneously hydrogen, a $C_{1-20}$ aliphatic hydrocarbon, benzene, phenyl, biphenyl, a group derived from an aromatic heterocycle or an aromatic ring, groups forming one or more fused ring structures, or a halogen, with at least one of $R_1$, $R_2$, $R_3$, $R_4$, $R_5$, and $R_6$ preferably not being a hydrogen;

X is nitrogen;

Y is oxygen, nitrogen, or sulfur; and $R_7$, when present, is a $C_{1-4}$ alkyl group, such as methyl or ethyl group, or a phenyl group; and n is a number ranging from 1 to 8, which is an indication of the extent of potential aggregates in the neat, crystalline material.

In one embodiment, Y is sulfur, R7 is absent, and $R_1$-$R_6$ are hydrogen atoms.

In another embodiment, Y is nitrogen, R7 is a methyl, ethyl, or phenyl, and $R_1$-$R_6$ are hydrogen atoms.

In a further embodiment, Y is sulfur, R7 is absent, and $R_1$-$R_6$ are hydrogen atoms.

In another embodiment, Y is oxygen, R7 is absent, and at least one of $R_1$-$R_6$ is a methyl, ethyl, halogen or phenyl group.

In some embodiments, one or more of the hydrogen atoms in the above Formulas 1-2 may be optionally substituted with deuterium.

Examples of organo-alkali metal salts that may be used in the invention include lithium 2-(2-pyridyl)phenolate (LiPP), lithium 2-(2',2''-bipyridine-6'-yl)phenolate (LiBPP), 2-(isoquinoline-10-yl)phenolate (LiIQP), lithium 2-(2-phenylquinazolin-4-yl)phenolate and lithium 2-(4-phenylquinazolin-2-yl)phenolate as set forth below.

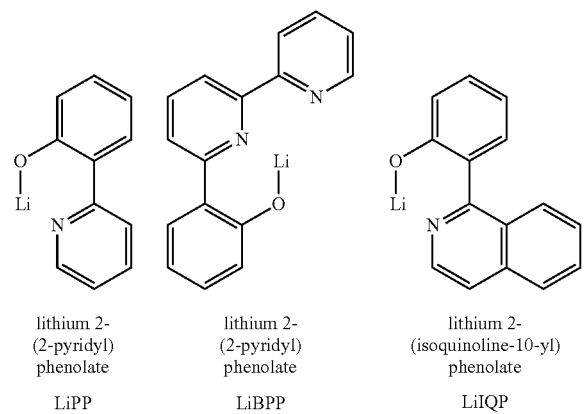

lithium 2-(2-pyridyl) phenolate
LiPP lithium 2-(2-pyridyl) phenolate
LiBPP lithium 2-(isoquinoline-10-yl) phenolate
LiIQP

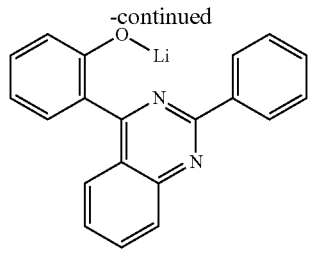

lithium 2-(2-phenylquinazolin-4-yl)phenolate

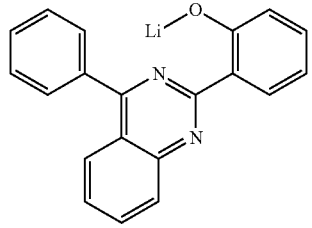

lithium 2-(4-phenylquinazolin-2-yl)phenolate

In some embodiments, the organo-alkali metal salts may be in the form of an aggregate. Examples of such aggregates may include dimers, trimmers, hexamers, quaternary aggregates, and combinations thereof.

In one embodiment, the composition comprises from 10 to 90 weight percent of at least one electron transport material, based on the weight of the composition. In a further embodiment, the composition comprises from 40 to 90 weight percent of at least one electron transport material, based on the weight of the composition, and in particular, from 50 to 80 weight percent of at least one electron transport material, based on the weight of the composition.

In one embodiment, the organo-alkali metal salt is capable of being purified via sublimation as is known to one of skill in the art. Preferably, the organo-alkali metal salt has a purity greater than 99%, and more preferably greater than 99.5% as measured by differential scanning calorimetry in accordance with procedure set forth in ASTM E 928. In one embodiment, the organo-alkali metal salt has less than 100 ppm of halogen containing impurities as measured by neutron activation analysis (NAA).

The composition includes at least one organo-alkali metal salt. Typically, the organo-alkali metal salt is present in an amount that is from 10 to 50 volume percent, based on the volume of the composition. In a further embodiment, the composition comprises from 20 to 50 volume percent of the organo-alkali metal salt, based on the volume of the composition.

In one embodiment, the composition comprises from 10 to 90 volume percent of the organo-alkali metal salt, based on the sum volume of the electron transport material and the organo-alkali metal salt. In a further embodiment, the composition comprises from 10 to 50 volume percent of the organo-alkali metal salt, based on the sum volume of the electron transport material and the organo-alkali metal salt. In a further embodiment, the composition comprises from 20 to 50 volume percent of the organo-alkali metal salt, based on the sum volume of the electron transport material and the organo-alkali metal salt.

Preferably, the composition has a glass transition temperature greater than 125° C., and more preferably, greater than 130° C., and even more preferably, greater than 140° C. as determined in accordance with the Flory Fox equation:

$$\frac{1}{T_g(\text{mix})} = \frac{w_1}{T_g(\text{ETL})} + \frac{w_2}{T_g(\text{Li}-\text{salt})}$$

wherein $w_1$ and $w_2$ are weight fractions of the electron transport material and the organo-alkali metal salt, respectively, $T_g$ (mix) is the glass transition temperature of the blend of the electron transport material and the organo-alkali metal salt, $T_g$ (ETL) is the glass transition temperature of the electron transport material, and $T_g$ (Li-salt) is the glass transition temperature of the organo-alkali metal salt.

In one embodiment, the composition comprising the blend of the electron transport material and the organo-alkali metal salt may be characterized by the absence of additional components that do not contribute to the charge transport properties of the composition. In one particular embodiment, the composition comprising the blend of the electron transport material and the organo-alkali metal salt is characterized by the absence of a binder, such as a polymeric binder.

Embodiments of the invention also provide a film formed from a composition comprising the blend of the electron transport material and the organo-alkali metal salt. Embodiments of the invention also provide an article comprising at least one component formed from an inventive composition. In a further embodiment, the article is an organic electroluminescent device.

Organic electroluminescent devices in accordance with embodiments of the invention may comprise a variety of different structures and configurations. For example, in one embodiment the device may comprise a pair of electrodes, and at least one electron transfer layer sandwiched between the electrodes, and comprising a blend of an electron transport material and an organo-alkali metal salt, wherein the organo-alkali metal salt has a glass transition temperature greater than 115° C.

In one embodiment, the article may comprise a multi-layered structure having anode and cathode layers between which are disposed a hole transport layer ("HTL"), an electron transport layer in accordance with embodiments of the invention, and one or more emissive layers that are disposed between the hole transport and electron transport layers.

Other OLED devices that may be prepared in accordance with the present invention include, for example, devices having inverted structures, devices having one or more additional ETL layers in contact with the composition comprising the blend of the ETL material and the organo-alkali metal salt having a glass transition temperature greater than 115° C., devices with graded organo-alkali metal salt concentrations, and devices comprising multiple electron transport and electron injection layers as well as one or more of hole transport and hole injection layers.

After the device has been prepared, a film encapsulating layer is preferably deposited over the device. As noted previously, the thin film encapsulating layer encapsulates the layers of the device to provide protection from an external environment containing moisture and oxygen. The organic layer of the thin film encapsulating layer is formed of polymer, and may be a single layer or a stacked layer formed of any one of, for example, polyethyleneterephthalate, polyimide, polycarbonate, epoxy, polyethylene, and polyacrylate. In a preferred embodiment, the encapsulating layer comprises epoxy.

In addition to OLED devices, compositions of the present invention may be used in other electronic devices including, for example, organic photovoltaics, batteries, fuel cells, organic thin film transistors, organic supercapacitors, and the like.

EXAMPLES

In the following examples, inventive film samples were prepared comprising a blend of an electron transport material and lithium 2-(2-pyridyl)phenolate (LiBPP) (LiBPP has a Tg of 125° C. as measured by the Tg of the blend and the Flory-Fox equation). Comparative film samples were prepared in which LiBPP was substituted with LiQ as an organo alkali-metal salt. Both the inventive and comparative samples were subjected to thermal testing using the Encapsulation Mimic Test to evaluate the performance of the blended materials under thermal conditions approximating those typically experienced during the encapsulation process. The procedures are described in greater detail below.

Thin Film Preparation/Deposition

The blended film samples were made by simultaneous physical vapor deposition of the electron transport material and the organo-alkali metal salt. Vapor deposition was carried out with an Å mod deposition chamber from Angstrom Engineering. Undoped silicon wafers, with a crystallographic orientation of <1 0 0> and a native oxide (Virginia Semiconductor Inc.) were mechanically affixed to a substrate holder using aluminum clips. The substrate holder was placed on a substrate stage which rotated at a rate of approximately 60 rpm. The pressure of the vacuum chamber prior to deposition was on the order of $10^{-7}$ Torr. A pneumatically controlled shutter between the source and the substrate was used to start and stop the deposition.

Prior to preparation of the blended electron transport material films, the tooling factors for both the electron transport material (ETM) and organo-alkali metal salt (AMS) were determined. This tooling factor is a geometric calibration describing the relationship between the thickness deposited at the substrate and the quartz crystal microbalance, QCM, used to monitor thickness. The tooling was important in ensuring that the ETM:AMS ratio was correct in the deposited film. The ETM:AMS ratio was also confirmed for some of the films using liquid chromatography (LC). The target blend ratio agreed to within 1 weight % of the value determined experimentally by LC. Each material was placed in a separate deposition crucible and heated until a deposition rate of 1 Å/s was reached for each material as measured by a quartz crystal microbalance (QCM). The summed deposition rate of the two materials at the substrate was 2 Å/s. The final thickness of the vapor-deposited film was nominally 50 nm. The absolute thickness of the final film was determined using variable angle spectroscopic ellipsometry.

Spectroscopic Ellipsometry:

Spectroscopic ellipsometry measurements were carried out on a M-2000D ellipsometer from J. A. Woollam. The wavelength range covered was 193 to 1000 nm which was achieved with a deuterium and quartz tungsten halide (QTH) lamps. The optical set-up consisted of the lamps, a fixed $MgF_2$ Rochon polarizer, the film of interest, rotating compensator, a fixed $MgF_2$ Rochon polarizer for the analyzer and a back-thinned silicon CCD array detector. An overhead optical camera was used to image the film in situ and assess if the film was changing (crystallization or dewetting) during the thermal cycling measurement. A look down detector was also used to align the sample wafer and assure data quality.

For thermal cycling experiments, a calibrated Instec temperature stage and Instec mK1000 temperature controller was supplied by J. A. Woollam. The incident angle of the ellipsometer was fixed at 70° C. due to the configuration of the quartz windows on the hot stage. The hot stage was enclosed to allow for sample purging; all samples were purged with nitrogen. A re-circulating chiller (Varian model 11505) was used to cool the stage. A 20 point calibration of the temperature stage was done by Instec, and the validity of this temperature calibration was confirmed in-house with melting point standards. The melting of stearic acid (melting point=69.6° C.) and benzoic acid (melting point=122.4° C.) melting point standards was observed with the overhead camera. The standards were used as-received from Sigma-Aldrich. A few crystals of the standard were placed on a silicon wafer. The wafer was placed on the hot stage and heated at a rate of 2° C./min. The midpoint between the beginning of melting and the completion of melting was used to determine the melting point.

Polystyrene was also used as a check on the hot-stage temperature. The Tg of the nominally 570 nm thick spun-cast PS films agreed with literature to within 3 degrees. The polystyrene samples for ellipsometry measurements were spun-cast from solutions of toluene onto undoped, 500 micron thick, 1 inch diameter silicon wafer (Virginia Semiconductor) with a native oxide. The PS solution was filtered through a 200 micron filter and enough solution was used to completely flood the surface of the silicon. The speed of the spin coater (Headway Research Inc., controller model: PWM32, bowl model CB 15) was then raised to 2000 rpm at an acceleration rate of 2500 rpm/second. The speed was held for 60 seconds and then immediately ramped to zero. Films were then placed in a vacuum oven overnight and held at 120° C. to remove residual solvent. The removal of residual solvent was confirmed by the reproducibility of Tg during repeated thermal cycling of the film.

Modeling Ellipsometry Data

A model was constructed to describe the psi and delta data collected using ellipsometry and determine the thickness during the thermal profile. A three layer model was used in all cases to describe the sample. The substrate was a silicon wafer (layer 1) with a native oxide layer (layer 2) over which a film of ETM:ASM was deposited (layer 3). The thickness of the native oxide layer was determined from several measurements of an as-received wafer. This thickness was then fixed during subsequent modeling of the data. The optical properties of silicon are known to change with temperature. The temperature dependence of these optical properties are taken into account; as the temperature changed during the thermal treatment of the film, the optical constants for silicon at the experimental temperature were used.

An isotropic Cauchy model was used to describe the ETM:ASM films. Since the thickness change is the parameter that is being used to determine the thermal stability of the electron transport layer or ETM:ASM blend, the differences in modeling will not change the trends observed in the data. For all the reported data, the Cauchy fits were fit over a wavelength range spanning from 500 to 1000 nm.

Temperature Cycling of Vapor-Deposited Films

The prepared film samples were then subject to thermal testing in a multi-stage process to determine how the blended material would behave at temperatures typically used during the encapsulation process. This thermal testing, referred to herein as the "Encapsulation Mimic Test" provides a means to evaluate whether the blend can be subjected to an encapsulation process with minimal, or preferably absence, of undesirable deterioration of the electronic properties of the electron transport layer.

In a first step, the samples were annealed after deposition using the ellipsometer temperature stage.

The sample was initially heated from room temperature to a temperature of 120° C. at a heating rate of 2° C. per minute. The thickness of the sample was measured at 120° C. (referred to as $h_{t=0\ min}$).

Once the sample reached 120° C., the temperature was held constant at 120° C. for 40 minutes. This second stage of the cycling mimics the epoxy curing step of the OLED encapsulation where the sample is heated to 120° C. for 40 minutes. After completion of the 40 minutes isothermal hold, the thickness of the sample is again measured (referred to as $h_{t=40\ min}$). From these thickness measurements, the change in thickness of the sample from the beginning to completion of the second stage can be determined.

In a third stage, temperature cycling was used to completely transform the as-deposited blend and compare the thickness change experienced during the encapsulation mimic step (stage 2) to the total thickness change. In this stage, the sample is heated until it transforms as evidenced by a sharp and sudden increase in the thickness versus temperature profile. Typically, the sample is heated to a temperature ranging from 150° C. to 200° C. depending on the glass transition temperature of the neat electron transport material.

In the fourth stage, the sample is then allowed to cool at a rate of 2° C. per minute. When the sample has cooled to a temperature of 120° C. the thickness of the sample was again measured (referred to as $h_{cooling}$). The measured thickness can then be used to determine the percent thickness change the sample experienced when subjected to the 40 minute isotherm at 120° C.

The percent thickness change was then used to compare the thermal robustness of the inventive samples to the comparative samples. With reference to FIG. 1, the stages of the Encapsulation Mimic Test are shown. The "trapezoidal" shaped cycle is used to mimic the encapsulation step. The pyramid-shaped temperature cycle is a point of comparison after re-vitrifying the as-deposited glassy material into a glass without any memory of the vapor deposition procedure used to prepare it. The thickness at 120° C. during the final cooling is the point where the glass would have transformed during the initial 120° C. isotherm had it been able to during the 40 minute hold.

The thickness change is defined as the percent change of the thickness during the 40 minute isothermal hold. The total thickness change is the difference between the as-deposited blend thickness at 120° C. at the start of the isothermal hold ($h_{t=0\ min}$) and the thickness at 120° C. during the final cooling step of the thermal treatment ($h_{cooling}$). The change in thickness during the isotherm at 120° C. is the difference in thickness at the start ($h_{t=0\ min}$) and end ($h_{t=40\ min}$) of the 40 minute isothermal hold; see the equation below.

$$h\_\%\ \text{change} = \frac{h_{t=40min} - h_{t=0min}}{h_{cooling} - h_{t=0\ min}} * 100\%$$

The results of the Encapsulation Mimic Test are provided in Table 1 below.

As can be seen in Table 1, the inventive blends provided significant improvements over the comparative blends that utilize LiQ as an alkali salt. In particular, the inventive blends exhibit a percent change in thickness that is less than 20%. In contrast, the comparative samples generally exhibited a percent change in thickness that was greater than 50%, even approaching 100%.

Preferably, the inventive composition comprising a blend of an electron transport material and an organo-alkali metal salt when subjected to the Encapsulation Mimic Test exhibit a % change in thickness that is less than 20%, preferably less than 18%, preferably less than 16%, preferably less than 14%, preferably less than 12%, and more preferably less than 10%. In one embodiment, the inventive composition comprising a blend of an electron transport material and an organo-alkali metal salt when subjected to the Encapsulation Mimic Test exhibits a % change in thickness that is between 8 and 20%, between 10 and 18%, or between 12 and 16%. In a preferred embodiment, the % change in thickness is between 9 and 19%.

TABLE 1

Encapsulation Mimic Test Results

| Sample No. | Composition ASM:ETM 1:1 | Tg of ETM (° C.) | Li ASM | $h_{t=0\ min}$ (nm) | $h_{t=40\ min}$ (nm) | $h_{cooling}$ (nm) | h % change |
|---|---|---|---|---|---|---|---|
| Comparative 1 | LiQ/ETL17 | 140 | LiQ | 46.99 | 48.79 | 48.85 | 96.77 |
| Example 1 | LiBPP/ETL17 | 140 | LiBPP | 43.12 | 43.35 | 44.36 | 18.55 |
| Example 2 | LiBPP/ETL17 | 140 | LiBPP | 43.15 | 43.4 | 44.49 | 18.66 |
| Comparative 2 | LiQ/ETL88 | 139 | LiQ | 53.71 | 55.01 | 55.09 | 94.20 |
| Comparative 3 | LiQ/ETL88 | 139 | LiQ | 53.54 | 54.74 | 54.74 | 100 |
| Example 3 | LiBPP/ETL88 | 139 | LiBPP | 50.18 | 50.42 | 52.12 | 12.37 |
| Example 4 | LiBPP/ETL88 | 139 | LiBPP | 50.48 | 50.71 | 52.2 | 13.37 |
| Comparative 4 | LiQ/ETL93 | 155 | LiQ | 52.6 | 53.62 | 54.63 | 50.25 |
| Example 5 | LiBPP/ETL93 | 155 | LiBPP | 45.44 | 45.63 | 47.51 | 9.18 |
| Comparative 5 | LiQ/L201 | 176 | LiQ | 41.66 | 41.67 | 45.53 | 0.26 |
| Example 6 | LiBPP/L201 | 176 | LiBPP | 45.72 | 45.9 | 47.46 | 10.34 |
| Example 7 | LiBPP/L201 | 176 | LiBPP | 45.56 | 45.77 | 47.35 | 11.73 |

The structures of L201, ETL 17, ETL 88, and ETL 93 are provided below.
LiQ was provided by Dow Electronic Materials.
LiBPP was purchased from Luminescence Technology Corp.

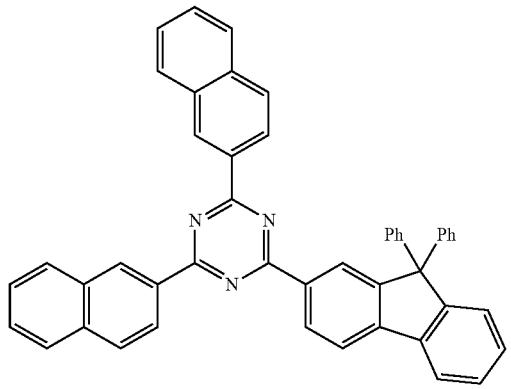

ETL88

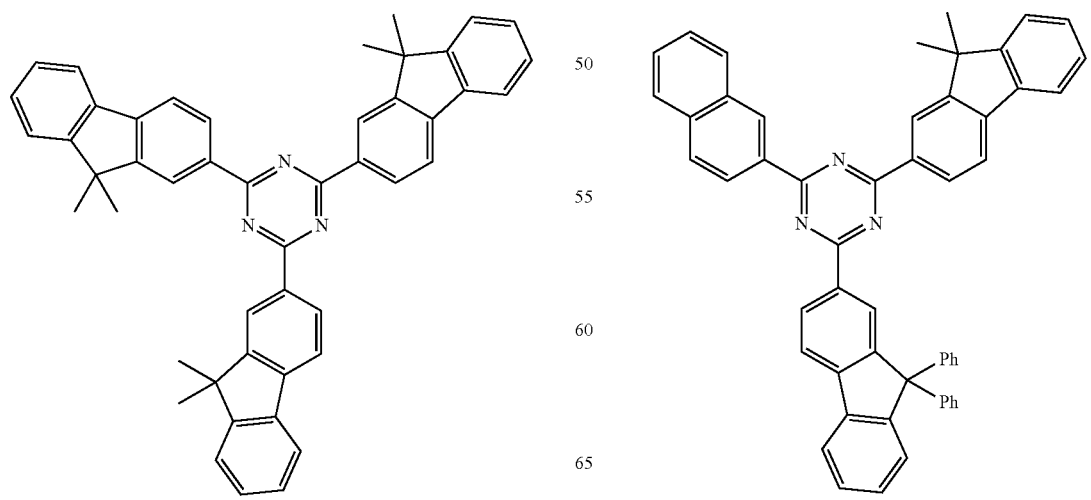

ETL17

ETL93

-continued

L201

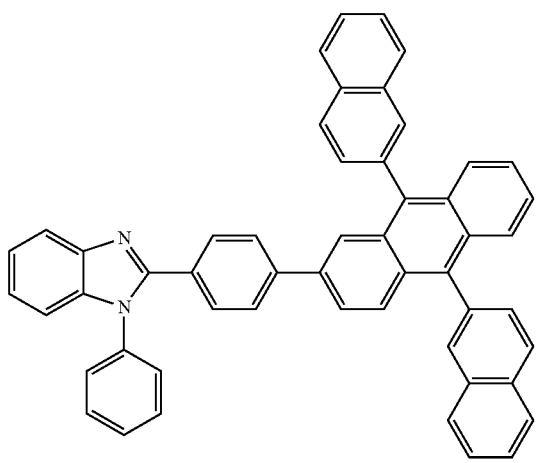

Computational Methodology:

The singlet ground-state geometry of the isolated ETLs (ETL17, ETL88, ETL93, L201) and Li-salts (LiQ hexamer and LiBPP tetramer) were computed using B3LYP/6-31g* (Becke, three-parameter, Lee-Yang-Parr) functional within density function theory calculations. See, generally, Becke, A. D. *J. Chem. Phys.* 1993, 98, 5648.

All these calculations used the closed shell approximation and were performed using Gaussian 09 suite of programs (see Gaussian 09, Revision A.02). The optimized geometries of the ETLs and Li-salts were used to compute the energies and charges, at DFT level (b-p and def-TZVP basis set). In addition, the conductor-like screening model (COSMO) is used to compute the atomic charges of all the compounds, in a dielectric medium (For these calculations, the permittivity of the chosen solvent is taken to be infinity). These calculations were performed using the Turbomole package. The generated output is fed into COSMOthermX and the miscibility gap is computed for each ETL-Li-salt binary mixture in isothermal (25° C.) condition. For all these binary mixtures, no miscibility gap is identified. For all these binary mixtures, no miscibility gap is identified. These results indicated that the Li-salts and ETLs can be mixed in different weight percents, without phase segregation. Since L-salts and ETL are miscible, the Flory-Fox equation is used to compute $T_g$ of the mixture.

Neutron Activation Analysis:

Samples were prepared by transferring approximately 0.2 grams of the powdered OLED into pre-cleaned ¼-dram polyethylene vials. Standards of I, Cl, Na, K and Br were prepared by transferring appropriate amounts of their NIST-traceable standard solutions into similar vials. The standards were diluted to the same volume as the samples using pure water. A blank sample, containing the pure water only, was also prepared. The vials were heat-sealed. The samples, standards and the blank were then analyzed following the standard NAA procedure, Global-SOP-01101.02 for I, Cl, Na, K and Br, using the Dow Mark I TRIGA nuclear reactor. Specifically, the samples were irradiated for 10 minutes at 250 kW of reactor power. After a waiting time of 10 minutes, the samples were transferred into un-irradiated vials and the gamma spectroscopy was done for 400 seconds each. These spectra were used to analyze for chlorine and iodine. After a waiting time of about 5 hours, the gamma spectroscopy was again done, and this time, for 4,000 seconds each. These spectra were used to analyze for sodium, potassium and bromine. The elemental concentrations were calculated using CANBERRA™ software and standard comparative technique. The detection limits of NAA for these elements are in sub-ppm levels with this procedure.

That which is claimed:

1. A composition for forming an electron transport layer comprising a blend of an electron transport material and an organo-alkali metal salt, the organo-alkali metal salt having a glass transition temperature greater than 115° C., wherein when subjected to an Encapsulation Mimic Test, a film formed from the composition exhibits a percent change in thickness that is less than 20%.

2. The composition of claim 1, wherein the electron transport material comprises an organic compound having a molecular weight from 350 to 1,000 Daltons.

3. The composition of claim 1, wherein the electron transport material comprises a polymer.

4. The composition of claim 1, wherein the blend is characterized by the absence of a binder.

5. The composition of claim 1, wherein the electron transport material has a HOMO level from about −4.5 to −7.0 eV, a LUMO level from about −1.0 to −2.5 eV, and a triplet energy greater than 1.0 eV.

6. The composition of claim 1, wherein the composition has a glass transition temperature greater than 125° C.

7. The composition of claim 1, wherein the organo-alkali metal salt has the following formula:

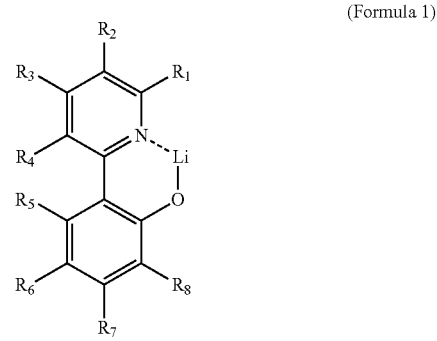

(Formula 1)

wherein $R_1$, $R_2$, $R_3$, $R_4$, $R_5$, $R_6$, $R_7$, and $R_8$ are independently or simultaneously hydrogen, deuterium, a $C_{1-20}$ aliphatic hydrocarbon, benzene, naphthalene, biphenyl, a group derived from an aromatic heterocycle or an aromatic ring, or groups forming one or more fused ring structures, and wherein at least one of $R_1$, $R_2$, $R_3$, $R_4$, $R_5$, $R_6$, $R_7$, and $R_8$ is not a hydrogen.

8. The composition of claim 1, wherein the organo-alkali metal salt has the following formula:

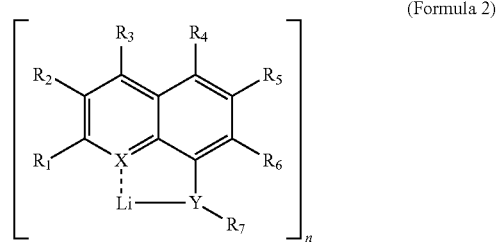

(Formula 2)

wherein $R_1$, $R_2$, $R_3$, $R_4$, $R_5$, and $R_6$ are independently or simultaneously hydrogen, deuterium, a $C_{1-20}$ aliphatic hydrocarbon, benzene, phenyl, biphenyl, a group derived from an aromatic heterocycle or an aromatic ring, groups forming one or more fused ring structures, or a halogen;

X is nitrogen;

Y is oxygen, nitrogen, or sulfur;

$R_7$ is a $C_{1-4}$ alkyl group, or a phenyl group, and n is a number from 1 to 8.

9. The composition of claim 8, wherein Y is nitrogen, R7 is a methyl, ethyl, or a phenyl, and $R_1$-$R_6$ are hydrogen or deuterium atoms.

10. The composition of claim 1, wherein the organo-alkali metal salt is selected from the group consisting of lithium 2-(2-pyridyl)phenolate, lithium 2-(2',2"-bipyridine-6'-yl)phenolate, lithium 2-(isoquinoline-10-yl)phenolate, lithium 2-(2-phenylquinazolin-4-yl)phenolate, and lithium 2-(4-phenylquinazolin-2-yl)phenolate.

11. The composition of claim 1, wherein when subjected to the Encapsulation Mimic Test, a film formed from the composition exhibits a percent change in thickness that is between 9 and 19%.

12. A film formed of the composition of claim 1.

13. An article formed from the film of claim 12.

14. An electronic device comprising a pair of electrodes and at least one electron transfer layer disposed therebetween, the electron transfer layer comprising a blend of an electron transport material and an organo-alkali metal salt, the organo-alkali metal salt having a glass transition temperature greater than 115° C., and wherein a film formed from the blend of an electron transport material and an organo-alkali metal salt when subjected to an Encapsulation Mimic Test exhibits a percent change in thickness that is less than 20%.

15. The device of claim 14, wherein the organo-alkali metal salt is selected from the group consisting of lithium 2-(2-pyridyl)phenolate, lithium 2-(2',2"-bipyridine-6'-yl)phenolate, and lithium 2-(isoquinoline-10-yl)phenolate.

16. The device of claim 14, wherein the blend of the electron transport material and the organo-alkali metal salt has a glass transition temperature of at least 125° C.

17. The device of claim 14, wherein the device is encapsulated in an epoxy film layer.

18. The device of claim 14, wherein a film formed from said blend of an electron transport material and an organo-alkali metal salt when subjected to the Encapsulation Mimic Test exhibits a percent change in thickness that is between 10 and 18%.

* * * * *